United States Patent [19]

Gariboldi et al.

[11] Patent Number: 4,882,532
[45] Date of Patent: Nov. 21, 1989

[54] ACTIVE OVERVOLTAGE CONTROL FOR INDUCTIVE LOAD DRIVING

[75] Inventors: Roberto Gariboldi, Lacchiarella; Alberto Gola, Broni, both of Italy

[73] Assignee: SGS-Thomson Microelectronics, s.r.l., Italy

[21] Appl. No.: 254,763

[22] Filed: Oct. 7, 1988

[30] Foreign Application Priority Data

Oct. 9, 1987 [IT] Italy .............................. 83662 A/87

[51] Int. Cl.$^4$ ........................ H02M 3/137; H02H 3/20
[52] U.S. Cl. .................................... 323/222; 323/285; 361/91; 361/111; 361/18
[58] Field of Search ................ 323/222, 282, 284, 285; 363/50, 52–58; 361/90, 91, 111, 152, 153, 187, 18; 318/139

[56] References Cited

U.S. PATENT DOCUMENTS 4,566,052 1/1986 Kammiller ....................... 323/285 X
4,727,308 2/1988 Huljack et al. ..................... 323/222

Primary Examiner—Patrick R. Salce
Assistant Examiner—Emanuel Todd Voeltz
Attorney, Agent, or Firm—Pollock, Vande Sande & Priddy

[57] ABSTRACT

A circuit for limiting the transient overvoltage across a power transistor connected in series with an inductive load between a supply rail and a ground rail of the circuit and operated to switch ON-OFF the inductive load utilizes a comparator circuit for switching-ON again the power transistor in order to discharge the energy stored in the load's inductance. The voltage across the power transistor is sensed by a first voltage divider, while a reference voltage is obtained by a second voltage divider connected between the supply and ground. The circuit is practically insensitive to temperature and to variations of the supply voltage and is easily implemented.

1 Claim, 1 Drawing Sheet

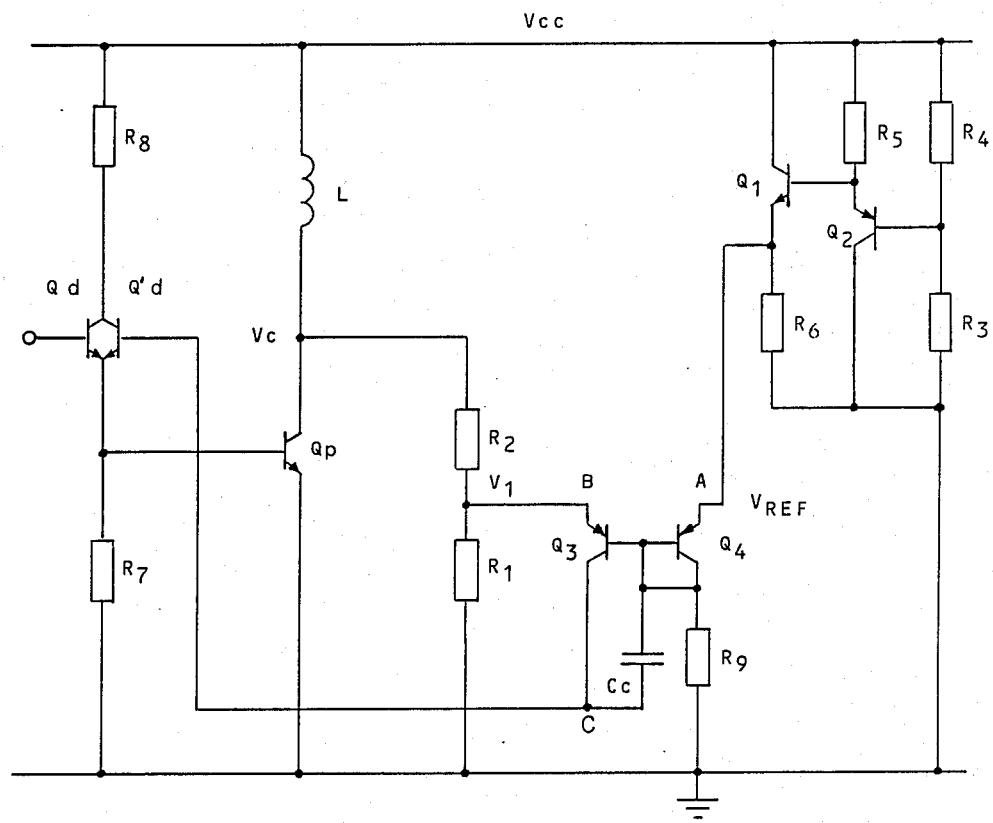

ACTIVE OVERVOLTAGE CONTROL FOR INDUCTIVE LOAD DRIVING

BACKGROUND OF THE INVENTION

1. Field of the Invention

The present invention relates to inductive load driving electronic circuits using semiconductor power devices for driving the load and, more in particular, to circuits of this kind monolithically integrated.

2. Discussion of the Prior Art

The fact that the driving of strongly reactive loads has the problem of transients is well known. When current is suddenly interrupted on a grounded inductive load, a negative overvoltage develops across the load due to the discharge of energy stored by the inductance during a charging phase (at the beginning of current flow through the inductive load). These negative voltage peaks, if unchecked in intensity, may produce breakdown of junctions and, in case of integrated circuits, may cause the triggering of parasitic transistors and of related "latch-up" problems. The remedy is that of providing means for discharging the energy stored in the inductance at a negative voltage lower than or equal to one VBE.

The prior art contemplates substantially two types of solutions:

a first solution contemplates the connection of a recirculation diode across the inductive load in order to provide a recirculation path to the discharge current of the stored energy;

another type of solution is recirculation of the discharge current of the energy stored in the inductive load through the driving power transistor itself, by connecting a control zener diode between the base and the collector of the power transistor.

The first of these known solutions has the drawback of requiring at least an additional power device, namely the recirculation diode, capable of sustaining the passage of a discharge current peak.

The second of these known solutions, though utilizing advantageously the same driver transistor for recirculating the discharge current, requires that the controlling zener diode be designed "ad hoc" in function of the supply voltage of the circuit in order to prevent interference during the charging of the inductance.

Lately active circuits have also been proposed for "switching-ON again" the power transistor driving the inductive load when the negative overvoltage across the latter rises over a certain value preset by a constant voltage generator. Also such a system is not free of drawbacks such as dependency of the triggering threshold of the control active circuit from parameters such as temperature and/or the supply voltage of the circuit.

OBJECTIVES AND SUMMARY OF THE INVENTION

Therefore, it is a main objective of the present invention to provide a circuit for limiting the transients overvoltage across a power transistor essentially connected in series with an inductive load, wherein the triggering characteristics of the control circuit are substantially independent of temperature and of changes of the supply voltage.

This objective and attendant advantages are achieved by means of the active circuit for the control of the overvoltage when driving inductive loads which is the object of the present invention as defined in the annexed claims.

BRIEF DESCRIPTION OF THE DRAWING

The invention and its advantages may be more easily described by making references to the annexed drawing, wherein a circuit diagram of a limiting circuit of the invention, as applied to a driving circuit for an inductive load made, for example, with bipolar transistors, is depicted.

DESCRIPTION OF THE PREFERRED EMBODIMENT

Switching of an inductive load (or circuit) L in switched type power converters, essentially requires a power transistor Qp connected substantially in series with the inductive load L between a supply rail Vcc and a ground rail of the circuit. The base of the power transistor is connected to the output terminal of a driver stage, formed by the transistor Qd and by the resistors R8 and R7 connected, respectively, between the collector and the supply rail and between the emitter and ground. The switching signal is applied to the base of the driver transistor Qd.

The circuit for the limitation of the transients overvoltage across the power transistor Qp of the present invention comprises essentially a voltage comparator, formed by transistors Q3 and Q4, by the resistor R9 and by a compensation capacitor Cc. Such a comparator circuit as well as its operation are well known to a skilled technician and the circuit has essentially two input terminals, respectively A and B and an output terminal C.

To the input B of the comparator a voltage V1 proportional to the voltage V2 existing across (between the collector and the emitter) the power transistor Qp is applied by connecting the terminal B of the comparator to an intermediate node of a voltage divider formed by the two resistors R2 and R1, which are connected in series between the collector and the emitter of the power transistor Qp.

To the other input A of the comparator a reference voltage Vref is applied, which purposely corresponds to a preset fraction of the supply voltage of the circuit Vcc.

This reference voltage Vref is obtained at an intermediate terminal of a second voltage divider formed by the two resistors R4 and R3 connected in series between the supply rail (Vcc) and the ground rail of the circuit.

Two buffering unity gain amplifying stages are employed for de-coupling appropriately the intermediate node of the voltage divider through which the reference voltage is sensed. Such a buffer element is formed by the two transistors Q1 and Q2 and by the respective load resistors R6 and R5.

The comparator circuit operates in the following way. When the voltage V1 present at the terminal B becomes higher than the reference voltage Vref present at the terminal A, the comparator changes state (i.e. the transistor Q3 which is normally OFF conducts) and the signal which becomes available at the output terminal C of the comparator may be utilized for switching ON again the power transistor Qp and for allowing dissipation of the energy stored in the inductance L allowing a discharge current toward ground.

In the circuit depicted in the FIGURE, the output terminal C of the comparator is connected to the base of the transistor Q'd of a pair of NPN bipolar transistors used in the driver stage of the power transistor Qp. Naturally, any other equivalent connection between the output terminal C of the comparator and the driver stage of the power transistor may be used.

By presetting appropriately the ratios of the two voltage dividers (R2 and R1; R4 and R3) a maximum value of the transients overvoltage across the power transistor Qp is set, which when reached (upon the switching-OFF of the power transistor Qp driving the load) the signal which becomes available at the output terminal C of the comparator is such as to substitute the switching signal and to return to a conduction state the power transistor Qp for a period of time sufficient to discharge to ground the energy stored in the inductance L and consequently to eliminate the cause of the overvoltage. With the decaying of the collector voltage Vc and therefore of V1 below the reference voltage Vref, the comparator changes state again, the transistor Q3 switches-OFF again and the change of the signal at the output C of the comparator causes the switching-OFF of the power transistor Qp which returns to its proper rest condition in absence of a signal from the driver circuit.

The operation of the circuit of the invention may be analyzed as follows.

When the power transistor Qp is in a saturated condition the comparator circuit is unbalanced being the voltage V1 present at its input terminal B lower than the voltage Vref present at the input terminal A and the output C of the comparator does not deliver any current.

When the power transistor Qp is switched-OFF by the switching signal, the collector voltage Vc starts to rise but is blocked at a value given by the following expression $$VC = \left(1 + \frac{R2}{R1}\right) V\text{ref} \tag{1}$$

Under these conditions in fact V1 is equal to Vref and the comparator delivers current through its output terminal C which switches-ON the driver transistor Q'd and consequently switches-ON also the power transistor Qp until the energy stored in the inductance L is dissipated.

In consideration of the fact that transistors Q1 and Q2 represent de-coupling buffers, it follows that $$V\text{ref} = \frac{R3}{R3 + R4} Vcc \tag{2}$$

By setting $\Delta V$, the maximum recirculation overvoltage desired, it follows that $$Vc = Vcc + \Delta V = \left(1 + \frac{R2}{R1}\right) V\text{ref} \tag{3}$$

By combining the two equations (2) and (3)

$$Vc = Vcc + \Delta V = \frac{\left(1 + \frac{R2}{R1}\right)}{\left(1 + \frac{R4}{R3}\right)} Vcc$$

by stating:

$$\alpha = \frac{R2}{R1} \text{ and } \beta = \frac{R4}{R3}$$

$$\Delta V = Vc - Vcc = \left(\frac{1+\alpha}{1+\beta} - 1\right) Vcc = \tag{5}$$

$$\frac{\alpha\beta}{1+\beta} Vcc = \frac{\alpha}{1+\beta} Vcc - \frac{\beta}{1+\beta} Vcc$$

From equation (5) it may be observed that the preset value of maximum overvoltage desired is practically insensitive to variations of temperature; that is $$\frac{\partial \Delta V}{\partial T} \simeq 0 \tag{6}$$

because both $\alpha$ and $\beta$ are independent of temperature.

It is further observed that the dependency of the maximum preset level of the recirculation overvoltage from the supply voltage Vcc is extremely reduced and substantially negligible. In fact:

$$\frac{\partial \Delta V}{\partial Vcc} = \frac{\alpha - \beta}{1 + \beta} \tag{7}$$

For example, if Vcc=5 V, $\Delta V$=0, 2 V and Vref=4 V $\alpha$=0.3 $\beta$=0.25
and therefore $$\frac{\partial \Delta V}{\partial Vcc} = 4\% \tag{8}$$

Moreover $$\frac{\partial \nabla V}{\partial \alpha} = \frac{Vcc}{1 + \beta} \tag{9}$$

$$\frac{\partial \Delta V}{\partial \beta} = -\frac{(1 + \alpha)}{(1 + \beta)^2} Vcc \tag{10}$$

and being $\alpha$ and $\beta$ simply voltage divider ratios an extremely high precision, for example within 1%, may be easily achieved.

For example by stating $$\frac{\Delta \alpha}{\alpha} = \frac{\Delta \beta}{\beta} = 1\% \tag{11}$$

it follows that for a maximum variation of $\alpha$ $$\frac{\partial \Delta V}{Vcc} = 0.24\% \tag{12}$$

and for a maximum variation of $\beta$ $$\frac{\partial \Delta V}{Vcc} = -0.2\% \tag{13}$$

In practice it is possible to set a certain recirculation overvoltage independently from the temperature and substantially unsensitive to changes of the supply voltage of the circuit Vcc as well as to the partition ratios $\alpha$ and $\beta$ (i.e. to variations within normal fabrication tolerances of the value of the integrated resistors forming the two voltage dividers).

Naturally, even though the circuit of the invention has been described in an embodiment utilizing bipolar transistors, the circuit of the invention may also be made with field effect or unipolar transistors, both of the J-FET and MOS-FET type.

What we claim is:

1. A circuit for limiting the transient overvoltage with an inductive load between as supply rail and a ground rail of the circuit and operated to switch ON and OFF said inductive load as a function of a switching signal applied to a control terminal of said power transistor, comprising:
   a first voltage divider connected across said power transistor;
   a second voltage divider connected between said supply rail and said ground rail;
   at least a unity gain buffer having an input terminal and an output terminal, the input terminal of which is connected to an intermediate node of said second voltage divider; and
   a voltage comparator having first and second input terminals and an output terminal, the first input terminal being connected to an intermediate node of said first voltage divider and the second input terminal being connected to the output terminal of said buffer;
   the output terminal of said comparator being connected to said control terminal of said power transistor;
   the intermediate nodes of said two voltage dividers being chosen such that, when the overvoltage across said first voltage divider rises beyond a limit value set by said second voltage divider, the comparator changes state and the level of the signal at the output terminal thereof becomes sufficient to switch-ON said power transistor.

* * * * *